United States Patent
Mann et al.

(10) Patent No.: US 9,529,276 B2
(45) Date of Patent: Dec. 27, 2016

(54) MICROLITHOGRAPHY PROJECTION EXPOSURE APPARATUS HAVING AT LEAST TWO OPERATING STATES

(75) Inventors: Hans-Juergen Mann, Oberkochen (DE); Winfried Kaiser, Aalen-Unterkochen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 992 days.

(21) Appl. No.: 13/040,956

(22) Filed: Mar. 4, 2011

(65) Prior Publication Data

US 2011/0200946 A1 Aug. 18, 2011

Related U.S. Application Data

(63) Continuation of application No. PCT/EP2009/006113, filed on Aug. 22, 2009.

(30) Foreign Application Priority Data

Sep. 29, 2008 (DE) .................. 10 2008 042 438

(51) Int. Cl.
*G03B 27/42* (2006.01)
*G03F 7/20* (2006.01)

(52) U.S. Cl.
CPC ....... *G03F 7/70475* (2013.01); *G03F 7/70191* (2013.01); *G03F 7/70283* (2013.01)

(58) Field of Classification Search
CPC .............. G03F 7/70191; G03F 7/70108; G03F 7/70075; G03F 7/20; G03F 7/70091; G03F 7/70116; G03F 7/702; G03F 7/70291; G03F 7/70283; G03F 7/70125; G03F 7/70475; G03F 7/704; G03F 7/70141; G03F 1/24; G03F 7/70275; G03F 7/70233; G02B 17/002; G02B 17/008; G02B 17/0812
(Continued)

(56) References Cited

U.S. PATENT DOCUMENTS 5,255,051 A 10/1993 Allen
6,295,119 B1 9/2001 Suzuki
(Continued)

FOREIGN PATENT DOCUMENTS

CN 101263430 A 9/2008
EP 1 884 831 A 2/2008
WO WO 2006117122 A1 * 11/2006

OTHER PUBLICATIONS

International Search Report and Written Opinion for corresponding PCT Appl. No. PCT/EP2009/006113, dated Nov. 27, 2009.
Taiwanese Office Action, with translation thereof, for TW Appl No. 098127714, dated Jul. 10. 2014.
Korean Office Action, with translation thereof, for corresponding Korean Patent application No. 10-2011-7006450, dated Dec. 7, 2015.

*Primary Examiner* — Mesfin T Asfaw
(74) *Attorney, Agent, or Firm* — Fish & Richardson P.C.

(57) ABSTRACT

A microlithography projection exposure apparatus for producing microelectronic components has at least two operating states. The microlithography projection exposure apparatus includes a reflective mask in an object plane. In the first operating state, a first partial region of the mask is illuminated by a first radiation, which has an assigned first centroid direction having a first centroid direction vector at each point of the first partial region. In the second operating state, a second partial region of the mask is illuminated by a second radiation, which has an assigned second centroid direction having a second centroid direction vector at each point of the second partial region. The first and the second
(Continued)

partial region have a common overlap region. Furthermore, the microlithography projection exposure apparatus can be configured in such a way that at each point of at least one partial region of the overlap region the scalar triple product of the normalized first centroid direction vector, the normalized second centroid direction vector and a normalized vector that is perpendicular to the mask is less than 0.05.

25 Claims, 12 Drawing Sheets

Related U.S. Application Data

(60) Provisional application No. 61/100,836, filed on Sep. 29, 2008.

(58) Field of Classification Search
USPC .......................................... 355/53, 55, 63, 67
See application file for complete search history.

(56) References Cited

U.S. PATENT DOCUMENTS

| | | |
|---|---|---|
| 6,526,118 B2 | 2/2003 | Komatsuda et al. |
| 6,833,854 B1* | 12/2004 | Sandstrom .................... 347/239 |
| 2001/0002301 A1 | 5/2001 | Suzuki |
| 2006/0104413 A1 | 5/2006 | Ohmi et al. |
| 2006/0139745 A1 | 6/2006 | Gui et al. |
| 2006/0146302 A1* | 7/2006 | Hauschild ...................... 355/52 |
| 2007/0058269 A1 | 3/2007 | Mann et al. |
| 2008/0024745 A1* | 1/2008 | Baselmans et al. ............ 355/67 |
| 2008/0278704 A1 | 11/2008 | Endres et al. |

\* cited by examiner

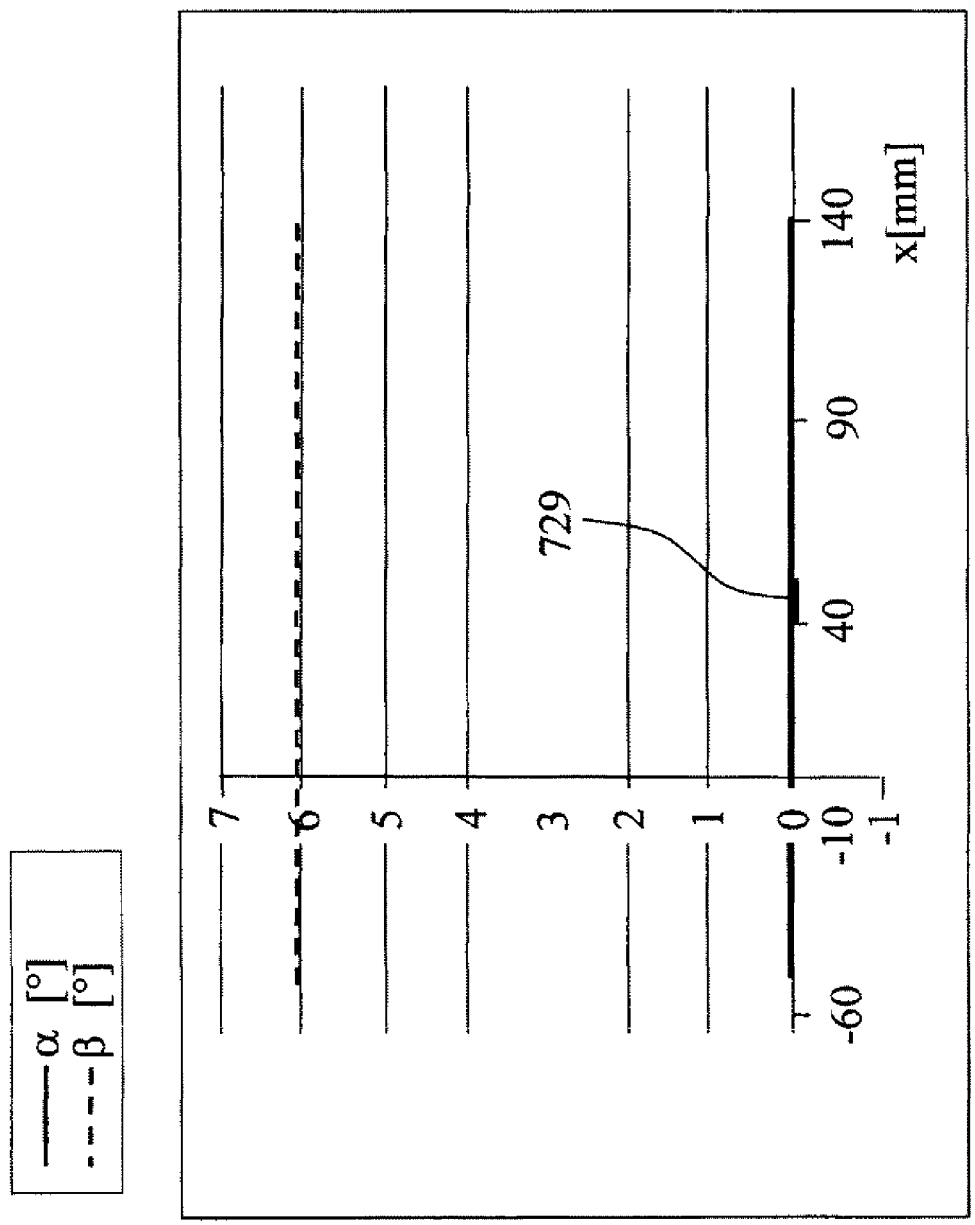

MICROLITHOGRAPHY PROJECTION EXPOSURE APPARATUS HAVING AT LEAST TWO OPERATING STATES

CROSS-REFERENCE TO RELATED APPLICATIONS

This application is a continuation of, and claims benefit under 35 USC 120 to, international application PCT/EP2009/006113, filed Aug. 22, 2009, which claims benefit of German Application No. 10 2008 042 438.2, filed Sep. 29, 2008 and U.S. Ser. No. 61/100,836, filed Sep. 29, 2008. International application PCT/EP2009/006113 is hereby incorporated by reference in its entirety.

FIELD

The present disclosure relates to a microlithography projection exposure apparatus for producing microelectronic components, where the microlithography projection exposure apparatus has at least two operating states, as well as a method for producing microelectronic components via lithography.

BACKGROUND

A microlithography projection exposure apparatus for producing microelectronic components and a related method are known, for example, from U.S. Pat. No. 6,295,119B1 and U.S. Pat. No. 6,526,118B2.

Microlithography projection exposure apparatuses used for producing microelectronic components include, among other things, a light source and an illumination system for illuminating a structure-bearing mask (the so-called reticle), and a projection optical unit for imaging the mask onto a substrate (the wafer). The substrate contains a photosensitive layer that is altered chemically upon exposure. This is also referred to as a lithographic step. In this case, the reticle is arranged in the object plane and the wafer is arranged in the image plane of the projection optical unit of the microlithography projection exposure apparatus. The exposure of the photosensitive layer and further chemical processes give rise to a microelectronic component.

Microlithography projection exposure apparatuses are often operated as so-called scanners. This means that the reticle is moved along a scanning direction through a slotted illumination field, while the wafer is moved correspondingly in the image plane of the projection optical unit. The ratio of the speeds of reticle and wafer corresponds to the magnification of the projection optical unit, which is usually less than 1.

In this case, the optical components of the illumination system and of the projection optical unit can be either refractive or reflective or diffractive components. Combinations of refractive, reflective and diffractive components are also possible. The reticle can likewise be embodied either in reflective fashion or in transmissive fashion. Such apparatuses are composed completely of reflective components particularly when they are operated with a radiation having a wavelength of less than approximately 100 nm, in particular of between 5 nm and 15 nm.

Such a microlithography projection exposure apparatus can have a limited illumination field and also a limited field that can be imaged. It may be desirable, however, to image a structure-bearing mask into the image plane, in which the substrate with the photosensitive layer is arranged, even if the mask is so large that either it cannot be completely imaged or it cannot be completely illuminated.

If the mask is larger only in one direction than the region that can be illuminated or imaged, the microlithography projection exposure apparatus can be operated as a scanner, such that the mask is moved through the slotted illumination field in the direction, while the wafer is moved correspondingly in the image plane of the projection optical unit. This means that, at least in principle, a mask of arbitrary size in the direction can be illuminated and imaged.

However, if the mask is larger in both directions than the region that can be imaged or illuminated, it may not be possible to rectify this scanning. In such a case, the structure-bearing mask is divided into at least two partial regions that are individually imaged or illuminated. This can conditionally be combined with a scanning process. In this case, the midpoints of the at least two partial regions are at a distance perpendicularly to the scanning direction, such that the combination of the at least two partial regions is larger than each of the individual partial regions. In combination with the movement in the scanning direction, a relatively large structure-bearing mask can thus be illuminated and imaged.

In order, however, to give rise overall to a complete image of the mask structure in the photosensitive layer, it is helpful if the partial regions at least partly overlap. This makes it possible to ensure that there are no regions of the mask which are inadvertently not imaged or not illuminated. However, these overlap regions cause problems in the configuration of the structure-bearing mask. Particularly in the cases where the mask is not illuminated perpendicularly, in the production of the mask it is desirable to take account of which centroid direction of the radiation is present at a point of the mask in the projection exposure apparatus. These effects can become worse the more the centroid direction of the radiation differs from perpendicular illumination. One may consider these problems if an angle between the first centroid direction and a normalized vector that is perpendicular to the mask at each point of at least one partial region of the overlap region is 3° or larger, especially 6° or larger.

The centroid direction of the incident radiation is understood to mean the average direction of the incident radiation. If a point is illuminated uniformly from all directions of a beam cone, then the axis of symmetry of the beam cone coincides with the centroid direction. In the case of non-uniform illumination, generally an energy-weighted average is formed, in which each direction is weighted with the intensity of the radiation coming from this direction. The centroid direction is then the average energy-weighted direction.

The centroid direction is taken into account in the production of the mask since shadow casting and projection effects that distort the image of the mask can occur during oblique illumination. Shadow effects can occur because such a structure-bearing mask is not completely planar. In the case of a reflective mask, the non-reflective regions are raised since at these locations one or more covering layers have been applied to one or more reflective base layers. Such a three-dimensional construction of the mask can therefore lead to shadow effects.

Shadow and projection effects can be taken into account in the production of a mask, however, with the result that the desired image arises in the image plane of the microlithography projection exposure apparatus.

If the overlap region is illuminated and imaged twice, this can give rise to specific desired properties for the centroid directions of the radiation of first and second exposures, in order still to be able to take account of shadow casting and projection effects.

SUMMARY

The present disclosure is intended to provide a microlithography projection exposure apparatus and a method for producing microelectronic components in which the specific desired properties are met.

According to the present disclosure, a microlithography projection exposure apparatus for producing microelectronic components can have at least two operating states. The microlithography projection exposure apparatus includes a reflective mask in an object plane. In this case, the microlithography projection exposure apparatus is configured such that in the first operating state a first partial region of the mask is illuminated by a first radiation, which has an assigned first centroid direction having a first centroid direction vector at each point of the first partial region. In the second operating state, a second partial region of the mask is illuminated by a second radiation, which has an assigned second centroid direction having a second centroid direction vector at each point of the second partial region. The first and the second partial regions have a common overlap region. At each point of at least one partial region of the overlap region the scalar triple product of the normalized first centroid direction vector, the normalized second centroid direction vector and a normalized vector that is perpendicular to the mask is thus less than 0.05, preferably less than 0.03, particularly preferably less than 0.01. This ensures that either the centroid direction vector averaged from the first and the second centroid direction vectors is perpendicular to the mask, such that there is no need to take account of projection and shadow effects in the overlap region, or that the first and the second centroid direction vectors do not differ significantly in their direction, such that it is possible to take account of the projection and shadow effects without any problems—since they are identical in both operating states. In the first case, the cross product of first and second centroid direction vectors is substantially perpendicular to the normalized vector on the mask, such that the scalar triple product is less than 0.05, preferably less than 0.03, particularly preferably less than 0.01. In the second case, first and second centroid direction vectors have substantially the same direction, such that the magnitude of the cross product is already small, whereby the magnitude of the scalar product between the cross product and a normalized vector that is perpendicular to the mask is then also less than 0.05, preferably less than 0.03, particularly preferably less than 0.01.

A configuration of the projection exposure apparatus in which the overlap region is smaller than the first partial region and is smaller than the second partial region has the effect that the combination of first and second partial regions is larger than first and second partial region respectively. This means that overall a larger structure-bearing mask can be illuminated and imaged.

If the projection exposure apparatus is additionally configured so that the orientation of the reflective mask in the first operating state differs from the orientation of the mask in the second operating state by a rotation through 180° about an axis perpendicular to the object plane, then such a projection exposure apparatus can be realized in a particularly simple manner. It is thereby possible to use a projection optical unit whose entrance pupil is not excessively far away from the object plane. Such projection optical units can be embodied with rotationally symmetrical reflective components, which are simpler to produce and measure than projection optical units that dispense with such rotational symmetry.

The disclosure furthermore relates to a microlithography projection exposure apparatus for producing microelectronic components, where the microlithography projection exposure apparatus has at least two operating states. In this case, the microlithography projection exposure apparatus includes a reflective mask in an object plane. The orientation of the reflective mask in the first operating state differs from the orientation of the mask in the second operating state by a rotation through 180° about an axis perpendicular to the object plane. This has the advantage that the illumination directions at the mask differ by the same rotation in both operating states. What is thereby achieved is that effects which occur on account of the oblique illumination in the case of reflective masks can be compensated for.

In the microlithography projection exposure apparatus according to the disclosure it is possible to use, in particular, radiation having a wavelength of between 5 nm and 15 nm. This has the advantage that particularly small structures can be imaged with the aid of such an apparatus.

Furthermore, the disclosure relates to a method for producing microelectronic components via lithography, in which a reflective structure-bearing mask in an object plane is imaged onto a substrate in an image plane. This method includes the following steps: a first exposure of a first partial region of the mask by a first radiation, which has a first centroid direction having a first centroid direction vector at each point of the first partial region; and a second exposure of a second partial region of the mask by a second radiation, which has a second centroid direction having a second centroid vector at each point of the second partial region. The first and the second partial regions have a common overlap region. In the overlap region, at each point the scalar triple product of the normalized first centroid direction vector, the normalized second centroid direction vector and a normalized vector that is perpendicular to the mask is less than 0.05, preferably less than 0.03, particularly preferably less than 0.01. This method has the advantage, among other things, that a structure-bearing mask that is simple to produce can be used. This is due to the fact that the projection and shadow effects can be taken into account in a simple manner owing to the specific relationship of the centroid direction vectors of first and second exposures of the partial region.

In the method according to the disclosure it is possible to use, in particular, a radiation having a wavelength of between 5 nm and 15 nm. This has the advantage that particularly small structures can be imaged with the aid of such radiation.

In addition, the method according to the disclosure can also be performed so that the first and second exposures take place via a scanning process in which the mask is moved through an illumination field along a first scanning direction during the first exposure and along a second scanning direction during the second exposure. Using the additional scanning process, an even larger structure-bearing mask can be illuminated and imaged.

If a projection exposure apparatus according to the disclosure is operated as a scanner, then the scanning directions during exposure of adjacent partial regions can be parallel or antiparallel. Parallel scanning directions have the advantage that all the exposure steps are identical since the mask is always moved from a starting position into an end position during the exposure, and no exposure takes place on the return path to the starting position. This means that the return path to the starting position does not have to be fulfilled with the same accuracy and so the desired properties due to the mechanical complexity of the projection exposure apparatus are less stringent. On the other hand, antiparallel scanning directions have the advantage that an exposure also takes place on the return path, such that a faster exposure operation can be made possible.

If the method or the projection exposure apparatus is performed so that the maximum angle between two arbitrary first centroid direction vectors or between two arbitrary second centroid direction vectors is less than 1°, then there is only small variation of the centroid direction vectors within the overlap region. This has the advantage that the intensity of the shadow and projection effects in the overlap region also varies only to a small extent.

If the method is additionally or alternatively performed so that the angle between a first and a second centroid direction vector at each point of the overlap region is less than 1°, then the projection and shadow effects during the first and second exposures are substantially identical, such that the effects can be compensated for in a relatively simple manner during the production of the structure-bearing mask.

In the case of a configuration of the method such that at each point of the overlap region the angle between the plane formed by the first and the second centroid direction vectors and the normalized vector that is perpendicular to the mask is less than 1°, this affords the advantage that the direction of the exposure radiation averaged over the two exposures is substantially perpendicular to the mask. This ensures that only few shadow and projection effects occur in the overlap region.

In particular, the method can also include a rotation of the structure-bearing mask in the object plane through 180° between the first and the second exposure. This has the advantage that the illumination directions at the mask differ during the first and the second exposure on account of the rotation. What is thereby achieved is that effects which occur as a result of the oblique illumination in the case of reflective masks can be compensated for.

BRIEF DESCRIPTION OF THE DRAWINGS

The disclosure is explained in greater detail with reference to the drawings.

FIG. 6b shows angle profile of the centroid direction vector in the case of the embodiment according to the disclosure according to FIG. 6a;

FIG. 7b angle profile of the centroid direction vector in the case of the embodiment according to the disclosure according to FIG. 7a.

DETAILED DESCRIPTION

Figure 1:
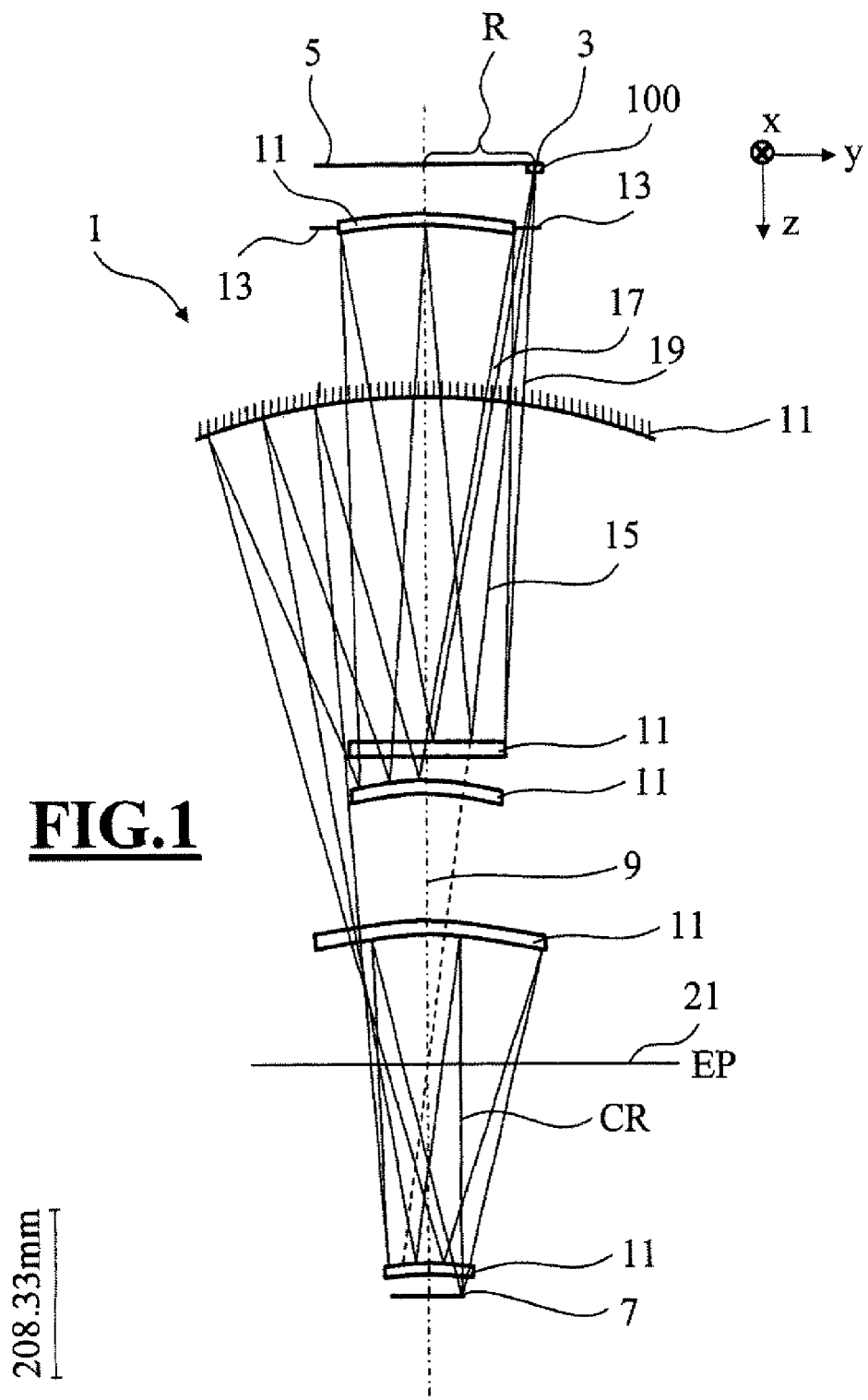
FIG. 1 shows a projection optical unit in a reflective configuration.

The reference symbols are chosen such that objects illustrated in FIG. 1 have been provided with single-digit or two-digit numbers. The objects illustrated in the further figures have reference symbols including three or more digits, where the last two digits specify the object and the digits placed before them specify the number of the figure in which the object is illustrated. Thus, the reference numerals of identical objects that are illustrated in a plurality of figures correspond in terms of the last two digits. By way of example, the reference symbols 3 and 403 identify the object 3, which is the object field in this case, in FIGS. 1 and 4. The explanation of an object with one reference numeral may therefore possibly be found in the description concerning one of the preceding figures under the corresponding reference numeral.

FIG. 1 shows an illustration of a reflective projection optical unit 1 of a microlithography projection exposure apparatus such as is known from the prior art. The projection optical unit 1 images an object field 3, which is arranged in the object plane 5, into the image plane 7. A structure-bearing mask (not illustrated in the drawing), the so-called reticle, is furthermore arranged at the location of the object field 3 in the object plane 5. A system of Cartesian coordinates is furthermore illustrated, the x axis of which system points into the plane of the figures. In this case, the x-y coordinate plane coincides with the object plane 1 and the z axis is perpendicular to the object plane 1 and points downward. The projection optical unit has an optical axis 9, which does not run through the object field. The mirrors 11 of the projection optical unit 1 have an optical surface that is rotationally symmetrical with respect to the optical axis. The aperture diaphragm 13 is arranged on the second mirror in the light path in this exemplary embodiment. The effect of the projection optical unit 1 is illustrated with the aid of three rays, the principal ray in the center of the object field 15 and the two aperture marginal rays 17 and 19. The principal ray in the center of the object field 15, which runs at an angle of 6° with respect to the perpendicular to the object plane, intersects the optical axis in the plane of the aperture diaphragm 13. As viewed from the object plane 5, the principal ray 15 appears to intersect the optical axis in the entrance pupil plane 21. The virtual image of the aperture diaphragm 13, the entrance pupil, thus lies in the entrance pupil plane 21. The center of the object field 3 is at a distance R from the optical axis 9 in order that no undesirable vignetting of the radiation proceeding from the object field occurs in the case of the reflective configuration of the projection optical unit.

Figure 2:
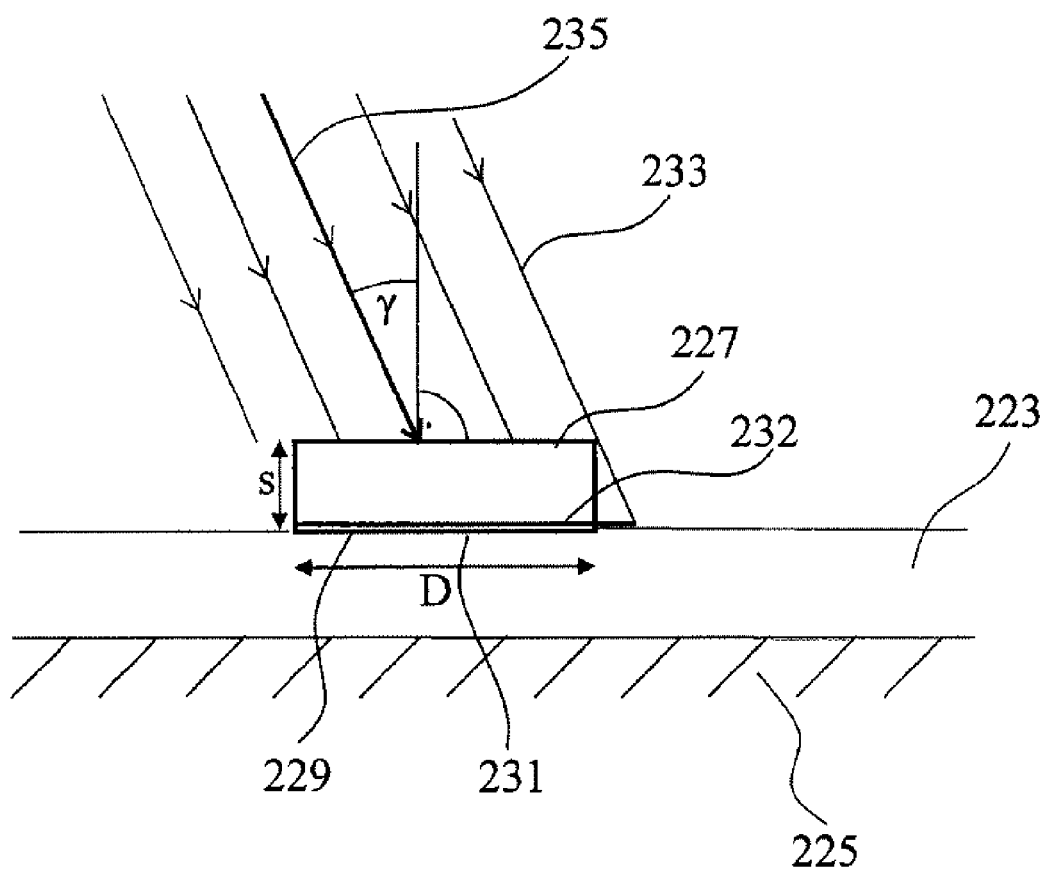
FIG. 2 shows an elevation of an excerpt from the structure-bearing mask.

FIG. 2 schematically shows an elevation of a part of the structure-bearing mask. The mask includes a reflective base layer 223 on a substrate 225 and an absorbent covering layer 227, which was applied only in a first partial region 229. The covering layer 227 has a thickness h usually in the region of approximately 100 nm. The first partial region 227 has an extent D. The center of the first partial region is identified by 231. If radiation is then incident on the mask with a centroid direction vector 235 having an angle γ with respect to the perpendicular to the mask, then the covering layer 227 casts a shadow on the reflective base layer, with the result that overall a second partial region 232 is not illuminated. The second partial region is larger than the partial region 231, however. Furthermore, the midpoint of the second partial region is displaced relative to the midpoint 231 of the first partial region. A widening and displacement of the non-reflective regions therefore occur on account of projection and shadow effects.

Figure 3:
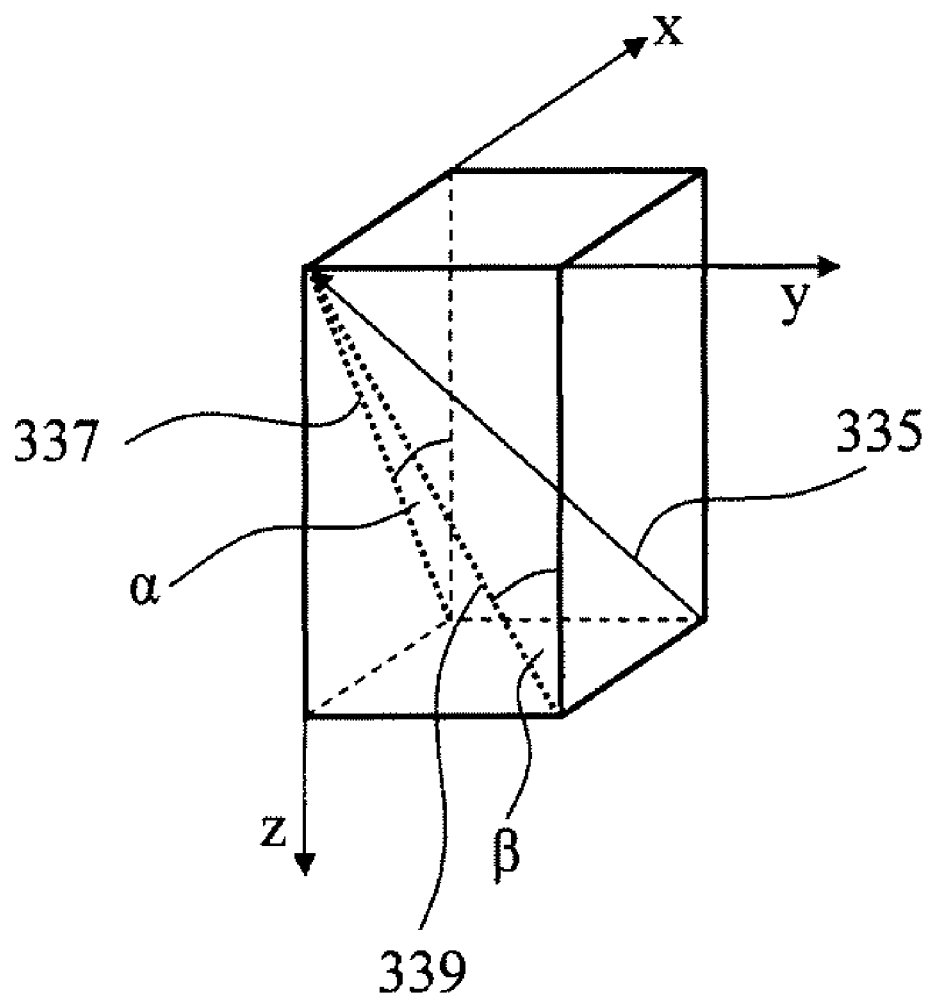
FIG. 3 shows a view of a beam at the reticle with definition of the angles α and β.

FIG. 3 illustrates by way of example a centroid direction vector 335 of the radiation prior to reflection at the reticle in a system of Cartesian coordinates. For better elucidation of the spatial orientation, the figure illustrates the projection 337 of the centroid direction vector 335 into the x-z plane and the projection 339 of the centroid direction vector 335 into the y-z plane. The centroid ray angle α denotes the angle between the projection 337 and the z axis and the centroid ray angle β denotes the angle between the projection 339 and the z axis. The normalized centroid direction vector can be unambiguously described with the aid of these two angles. If the centroid direction vector before reflection $\vec{s}$ in the system of coordinates illustrated is described by $$\vec{s} = \begin{pmatrix} s_x \\ s_y \\ s_z \end{pmatrix}$$

the angles are defined by $$\alpha = \arctan\left(\frac{s_x}{s_z}\right) \text{ and } \beta = \arctan\left(\frac{s_y}{s_z}\right).$$

In the case illustrated, the components $s_x$, $s_y$ and $s_z$ are all negative (the vector 335 points upward toward the left). The angles α and β are thus positive. By virtue of the fact that the radiation is reflected at the reticle and the reticle is arranged in the x-y plane, the following holds true for the centroid direction vector of the radiation after reflection $\vec{s}'$:

$$\vec{s}' = \begin{pmatrix} s_x \\ s_y \\ -s_z \end{pmatrix}$$

and the following hold true for the corresponding angles after reflection $$\alpha' = -\alpha \text{ and } \beta' = -\beta.$$

In order that the centroid direction vector $\vec{s}'$ is directed such that it points to the center of the entrance pupil at each point of the object field, the centroid direction vector $\vec{s}$ of the illumination radiation has to have a specific profile resulting from the position of the entrance pupil.

Figure 4A:
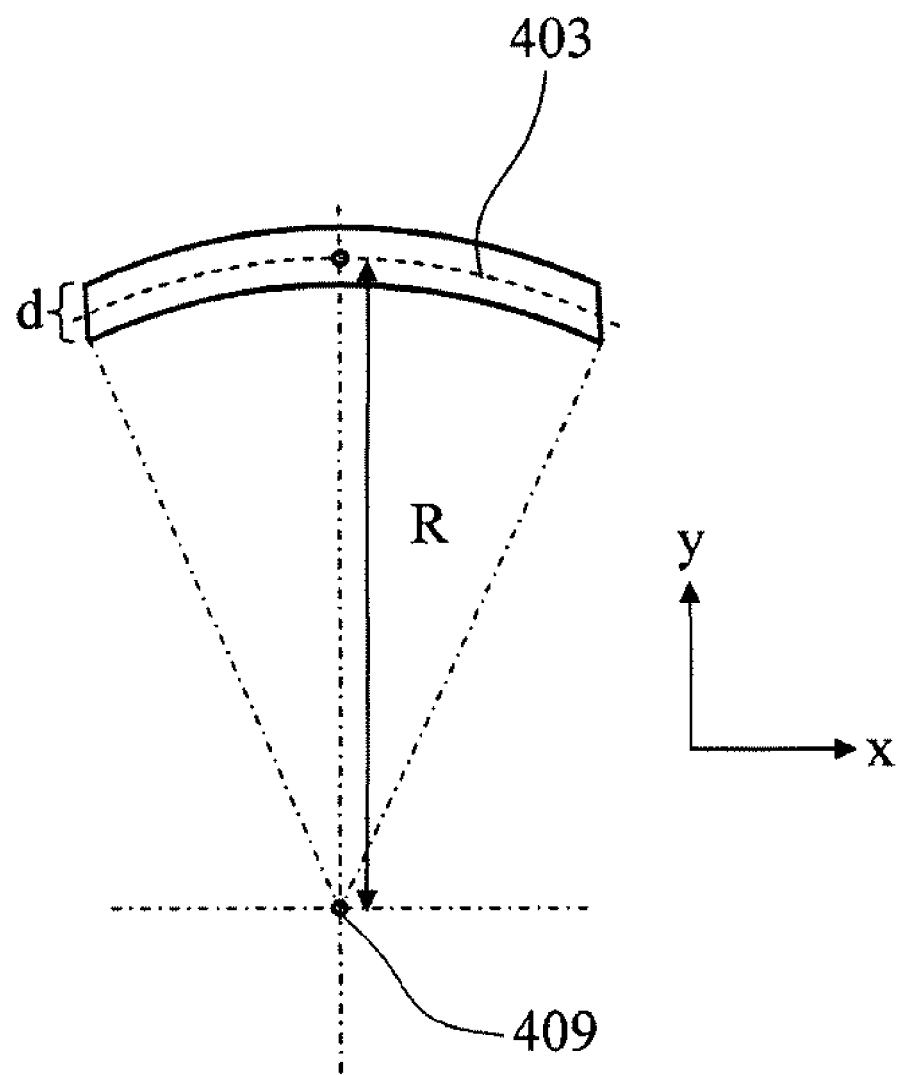
FIG. 4a shows a plan view of the arcuate field to be imaged.

FIG. 4a shows a plan view of an arcuate object field 403 such as occurs in the case of the projection optical unit 1 illustrated in FIG. 1, and a system of Cartesian coordinates, the axes of which correspond to those from FIG. 1. The object field 403 is an excerpt from an annulus whose center is through the point of intersection of the optical axis 409 with the object plane. The average radius R is 135 mm in the case illustrated. The width of the field in the y direction d is 8 mm here. As an alternative, a curved object field can also be delimited by two circle arcs which have the same radius and are displaced with respect to one another in the y direction. For operation of a projection optical unit such as is illustrated in FIGS. 1 and 2, the object field 403 is illuminated in such a way that the centroid direction of the radiation at a point of the object field 403, after reflection at the reflective reticle, runs substantially in the direction of the connecting line between the point of the object field and the center of the entrance pupil. If the projection exposure apparatus is operated as a scanner, then the scanning direction runs in the direction of the shorter extent of the object field, that is to say in the direction of the y direction.

Figure 4B:
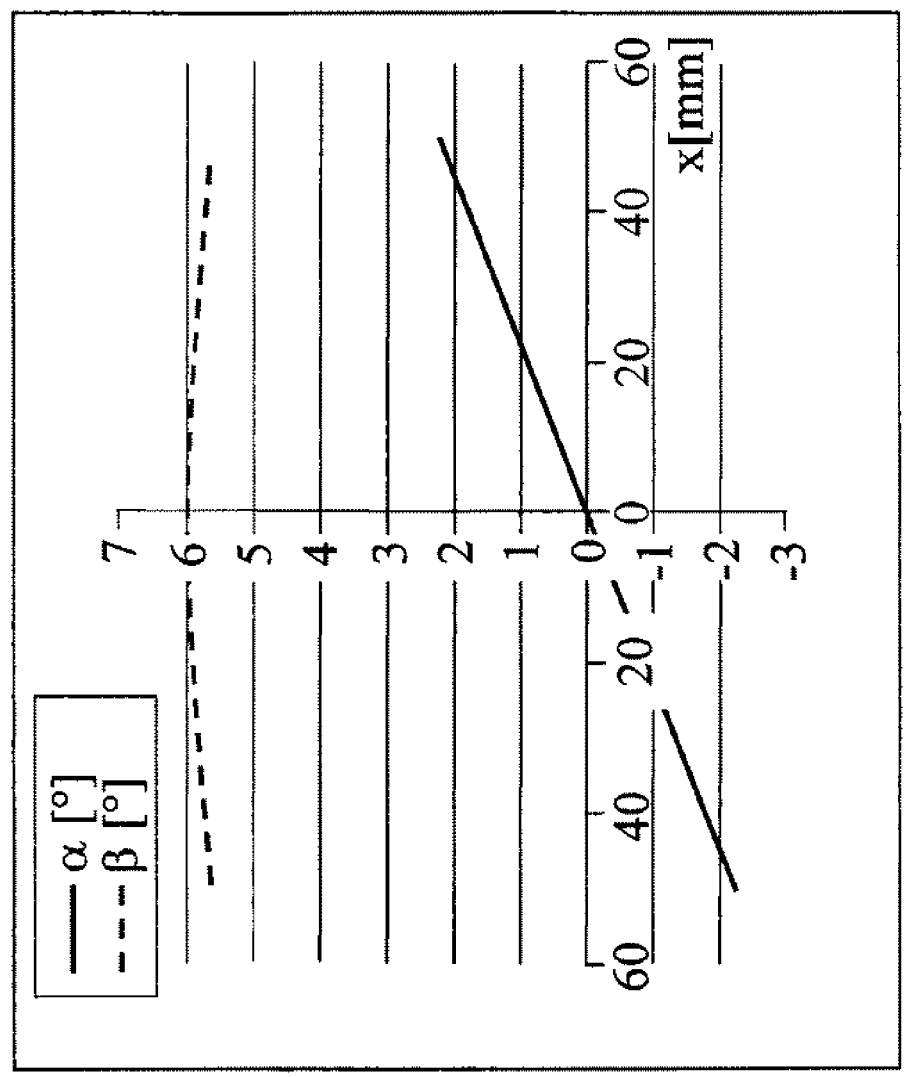
FIG. 4b shows angle profiles of the centroid direction vector in the case of a projection exposure apparatus such as is known from the prior art.

FIG. 4b illustrates a profile of the centroid ray angles for a specific exemplary embodiment. Here the optical axis is at a distance of R=135 mm from the center of the object field and the entrance pupil lies at a distance of 1284.4 mm from the object plane. These values produce a reflection angle between the centroid direction $\vec{s}'$ and the perpendicular to the object plane of 6°.

Since only the upper semi-arc illustrated in FIG. 2 is relevant, there is precisely one positive value y for each value x, such that the point (x,y) lies on the semicircle arc with the radius R=135 mm. It is thus possible to calculate the angles α' and β' as a function of coordinate x by linking the point (x, y) to the center of the entrance pupil. With the aid of the relationship above, the angles α and β prior to reflection result therefrom by a sign change. Even if the extent of the field in the y direction is 8 mm in the present case, although there are plurality of points $y_0$ for each fixed value $x_0$, such that the point ($x_0$, $y_0$) lies within the object field, the centroid ray angles do not vary greatly over these points. Furthermore, a projection exposure apparatus according to the disclosure is usually operated in a scanning mode in which the structure-bearing mask is moved through the object field in the y direction. Consequently, each point of the mask having the coordinate $x_0$ is illuminated with radiation having a centroid ray angle averaged over all points $y_0$. For these reasons, for the consideration below it suffices to consider the centroid ray angles on the semicircle arc with R=135 mm.

It becomes clear with reference to FIG. 4b that the angle α for x between −50 mm and 50 mm should vary between −2.23° and 2.23°, whereas a variation of the angle β between 5.57° and 6° is desired. However, such a variation of the centroid ray angles involves adaptations in the design of the structure-bearing mask. If the centroid direction vector is not perpendicular to the structure-bearing mask, then this leads to a displacement of the image of the structure on account of shadow casting and projection effects. As long as the centroid direction vector is identical at all locations of the mask, the result is substantially a global displacement. If the centroid direction vector changes over the structure-bearing mask, however, then different displacements arise from location to location, which overall leads to a displacement and a distortion of the image of the mask. The greater the variation of the centroid ray angles, the greater the resultant distortion. In the present case, the distortion in the y direction can largely be disregarded since the angle β varies only by approximately 0.4°. In contrast, the variation of α is greater by a factor of 10 and therefore leads to a distortion in the x direction. Both the distortion and the displacement are taken into account in the design of the mask, with the result that the desired image arises in the image plane of the projection exposure apparatus.

Figure 5A:
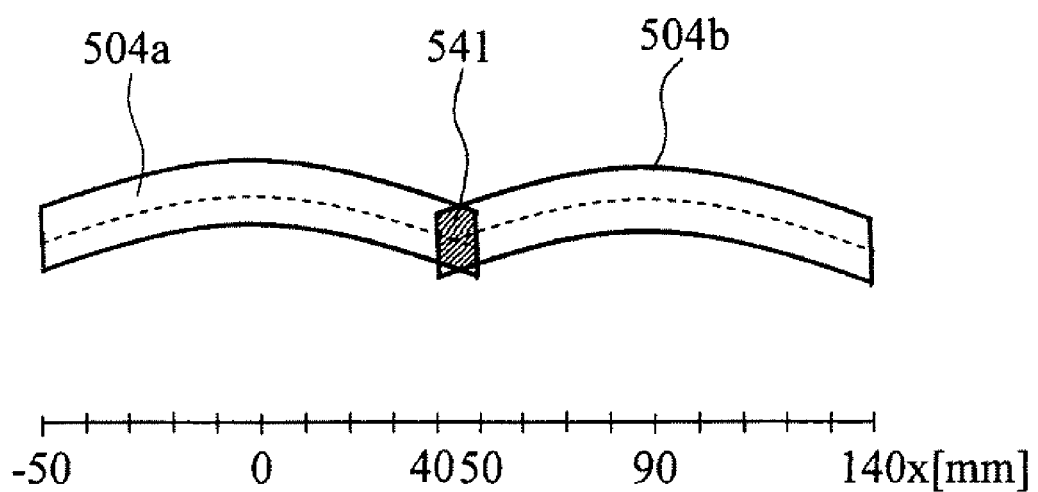
FIG. 5a shows juxtaposed partial regions such as are known from the prior art.

FIG. 5a shows two partial regions 504a and 504b of the mask. The partial regions 504a and 504b correspond in each case to the object field 403 illustrated in FIG. 4a. Since the object field is that region of the object plane which can be illuminated and imaged with the desired quality, the partial regions are desirably smaller than the object field or at most equal in size to the object field. In order to have the effect that the largest possible region of the mask is illuminated and imaged, the partial regions are chosen to be identical to the object field of the projection optical unit. However, it is also possible to illuminate and image only a part of the object field. Hereinafter the partial regions always correspond to the respective object fields.

The projection exposure apparatus carries out a first exposure of the left-hand partial region 504a in a first operating state and thereafter a second exposure in a second operating state of the projection exposure apparatus, the right-hand partial region 504b being exposed during the second exposure. In this case, the juxtaposition of the partial regions shown corresponds here to an embodiment known from the prior art. Such a juxtaposition of object fields is desired whenever the extent of the structure-bearing mask is larger than the region which can be illuminated or imaged. Therefore, a first partial region 504a of the structure-bearing mask is illuminated in the first operating state and a second partial region 504b of the mask is illuminated in the second operating state. The two partial regions have a common overlap region 541. For reasons of illustration, the overlap region here has an extent in the x direction of 10 mm. It is advantageous, however, for the overlap region to be as small as possible in order to result in a largest possible region to be imaged. Extents of 1-2 mm or less in the x direction are desirable. In order to improve the maximum resolution of a projection optical unit it is desirable to shift to higher apertures. In order that a comparable or better imaging quality remains ensured, however, it is often desirable to reduce the size of the object field since otherwise more severe image aberrations occur. This then results in the desire to juxtaposing object fields. An overlap region of the two object fields is desired to prevent parts of the structure from not being illuminated or imaged. Since an exact alignment of the object fields cannot be guaranteed a hundred percent, it is simpler to have a certain overlap region, such that the complete desired region is in any event illuminated and imaged, than risking a situation, on account of an incorrect setting, where parts of the structure are not imaged or are not illuminated. However, since each point in the overlap region is now illuminated or imaged twice, problems can occur since the centroid ray angles of the first and second illuminations are different.

Figure 5B:
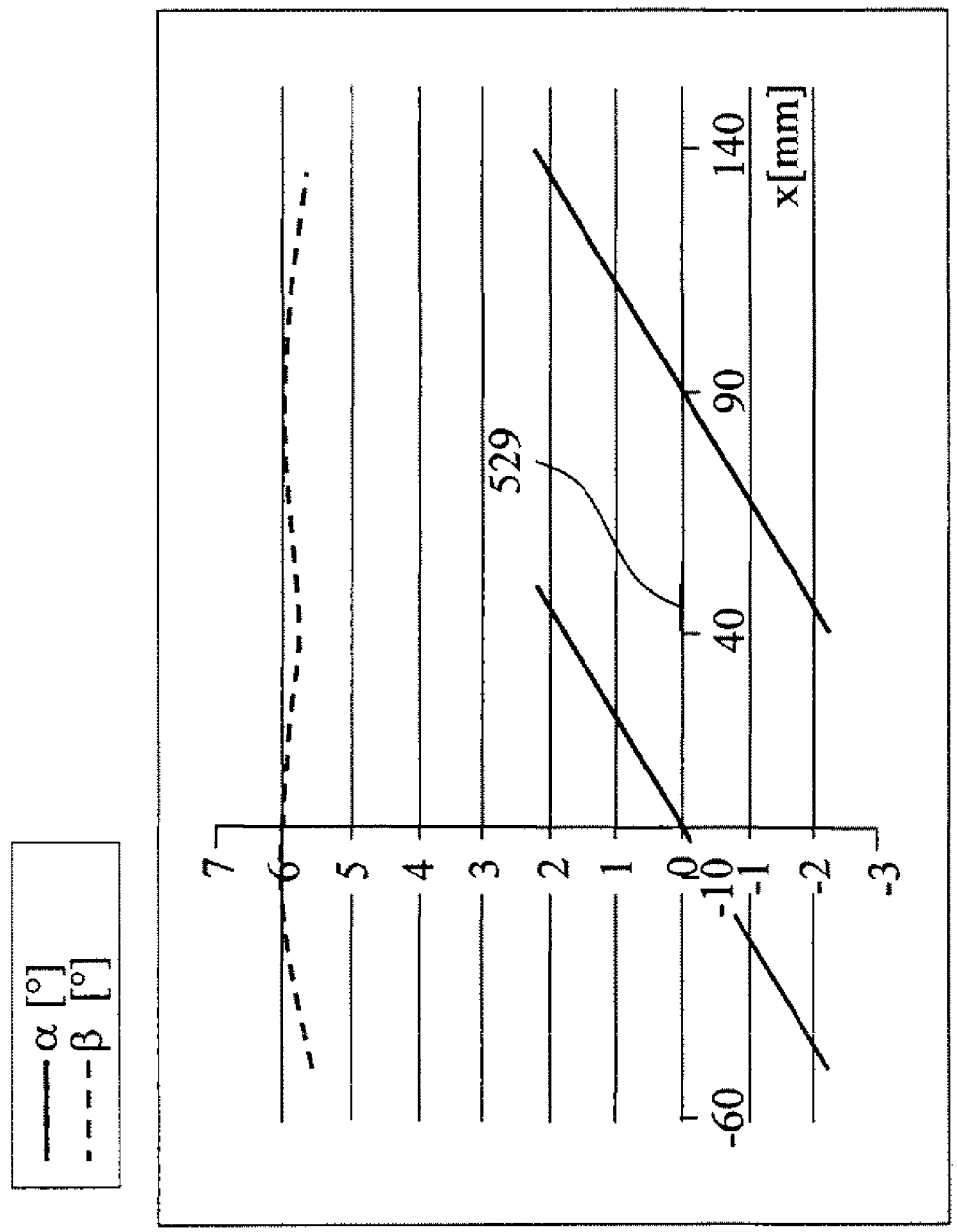
FIG. 5b shows angle profiles of the centroid direction vectors in the case of an embodiment according to FIG. 4a such as is known from the prior art.
Figure 6A:
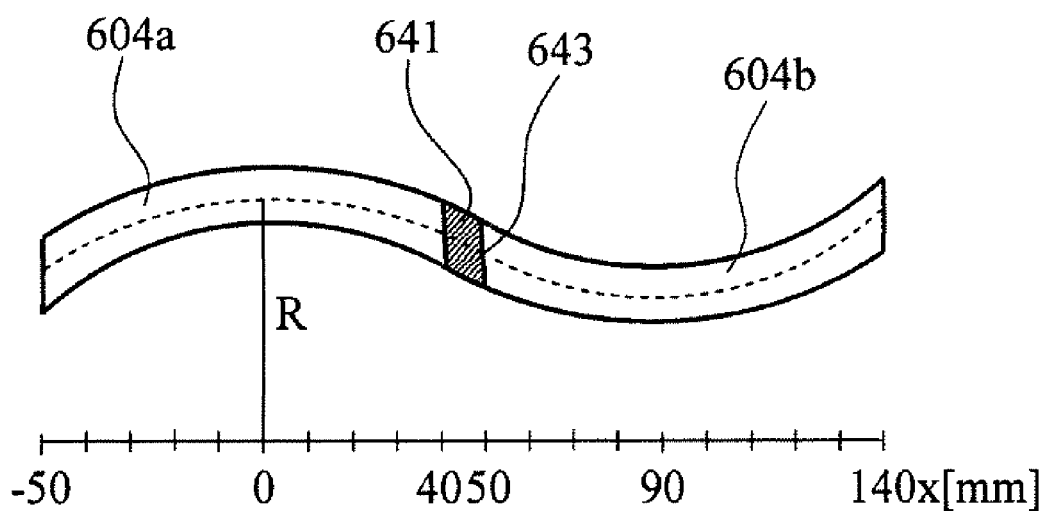
FIG. 6a shows juxtaposed partial regions according to one embodiment of the disclosure.

FIG. 5b shows the profile of the two centroid ray angles for points on the semicircle arcs with radius R=135 mm such as are present in both operating states for the respective object fields. While the angle β in the overlap region 541, does not have a large difference in both operating states, the angle α differs by more than 4° in the two operating states. Therefore, the structure-bearing mask, in the overlap region, is illuminated from different directions in the two operating states. It is thus relatively difficult to take account of projection and shadow effects in the production of the mask. These disadvantages are overcome in the development according to the disclosure. FIG. 6a shows two juxtaposed partial regions 604a and 604b in a development of the projection exposure apparatus according to the disclosure. In this case, a first exposure of the left-hand partial region 604a is carried out in a first operating state of the projection exposure apparatus and thereafter a second exposure of the second partial region 604b is carried out in a second operating state of the projection exposure apparatus. Between the two exposure steps the structure-bearing mask is rotated through 180° about an axis perpendicular to the object plane. This has the effect that the two arcuate object fields differ in their relative orientation by a rotation through 180°. As an alternative, it is also possible to rotate the projection optical unit and the illumination optical unit through 180° about an axis perpendicular to the object plane. This would also result in the two object fields differing by a rotation through 180° in the two operating states.

Figure 6B:
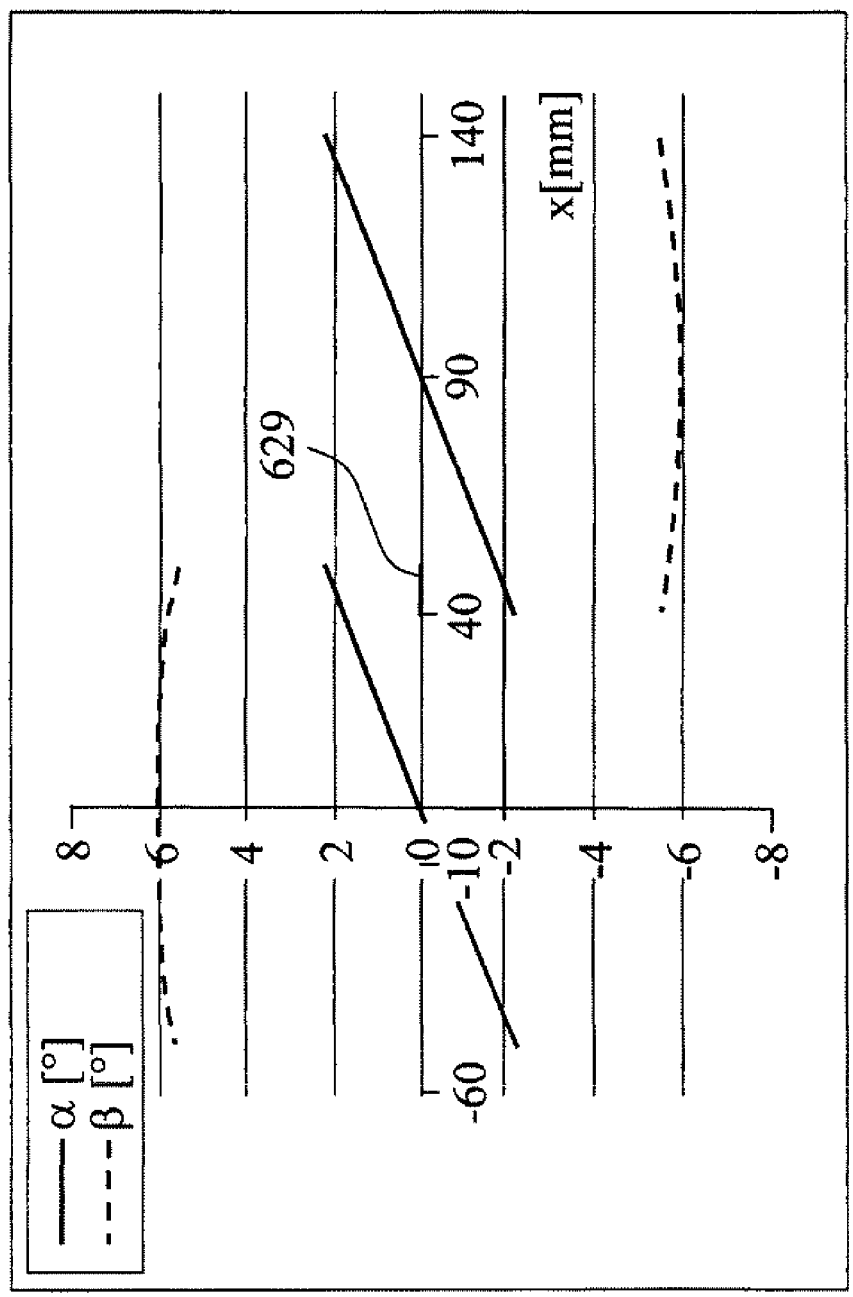

The change in orientation of the object fields as shown has the effect that the centroid ray angles also change. FIG. 6b illustrates the profile of the centroid ray angles for this exemplary embodiment. While the profile of the angle α does not change, the rotation of the mask or of the illumination and projection optical units leads to a change in the sign of the angle β. At a point of the overlap region 641, therefore, the angles α and β essentially differ by a change in sign in the two operating states. This has the advantage that, averaged over both operating states, the mask is illuminated perpendicularly in the overlap region, and so for example there is no occurrence of a displacement of the structures such as was explained in connection with FIG. 2.

The point 643 lying in the overlap region can be considered as an example. This point has the x coordinate $x_p=50$ mm, and the y coordinate $y_p=125.4$ mm and thus lies on the circle arc with radius 135 mm and lies in the overlap region. The left-hand partial region 604a is illuminated and imaged in the first operating state. In this case, the entrance pupil lies at the coordinates $x_{EP}=0$, $y_{EP}=0$, $z_{EP}=1284.4$ mm. In order that the centroid direction of the radiation runs in the direction of the entrance pupil after reflection, the following holds true for the first centroid direction vector $\vec{s}_1$:

$$\vec{s}_1 = \frac{1}{\sqrt{(x_{EP}-x_P)^2+(y_{EP}-y_P)^2+(z_{EP}-z_P)^2}} \begin{pmatrix} x_{EP}-x_P \\ y_{EP}-y_P \\ -(z_{EP}-z_P) \end{pmatrix}$$

$$\approx \begin{pmatrix} -0.0387 \\ -0.0971 \\ -0.9945 \end{pmatrix}$$

The right-hand partial region 604b is illuminated and imaged in the second operating state. In this case, the entrance pupil lies at $x_{EP}=90$, $y_{EP}=254.56$, $z_{EP}=1284.4$ mm. This position results from the fact that the partial region 604a lies such that at x=45 mm, that is to say in the center of the overlap region, the circle arc with the radius 135 mm of the partial region 604a intersects the corresponding circle arc of the partial region 604b. The centroid direction vector $\vec{s}_2$ thus has the value $$\vec{s}_2 = \frac{1}{\sqrt{(x_{EP}-x_P)^2+(y_{EP}-y_P)^2+(z_{EP}-z_P)^2}} \begin{pmatrix} x_{EP}-x_P \\ y_{EP}-y_P \\ -(z_{EP}-z_P) \end{pmatrix}$$

$$\approx \begin{pmatrix} 0.0310 \\ 0.1000 \\ 0.9945 \end{pmatrix}$$

The normalized vector that is perpendicular to the mask has the following notation in this system of coordinates:

$$\vec{n} = \begin{pmatrix} 0 \\ 0 \\ 1 \end{pmatrix},$$

with the result that the scalar triple product has the value S:

$$S = \vec{n} \cdot (\vec{s}_1 \times \vec{s}_2) \approx 0.00086$$

Figure 7A:
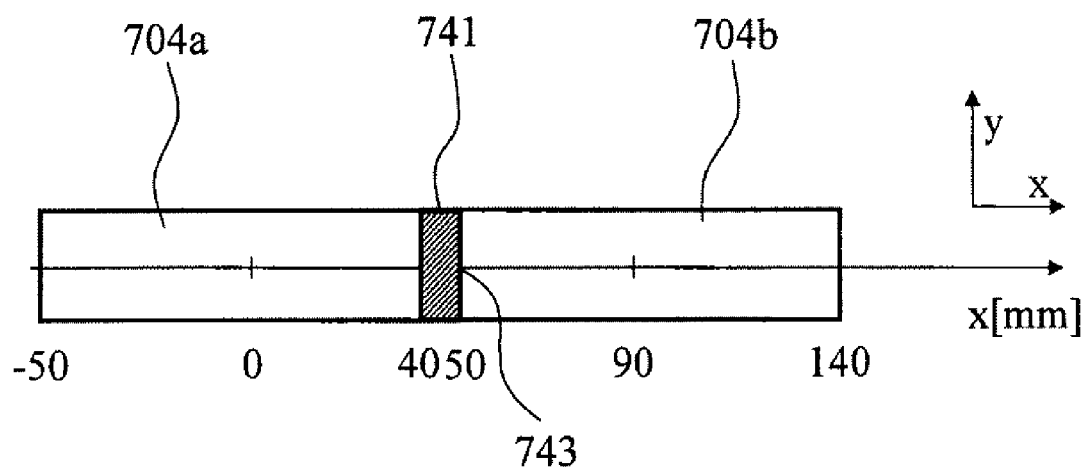
FIG. 7a juxtaposed partial regions according to a further embodiment of the disclosure.

FIG. 7a shows two juxtaposed partial regions in an alternative development of the projection exposure apparatus according to the disclosure. In this case, the first exposure of the left-hand partial region 704a is carried out in a first operating state of the projection exposure apparatus and thereafter a second exposure of the right-hand partial region 704b is carried out in a second operating state of the projection exposure apparatus.

The object fields of the projection optical unit are rectangular in this case, such that the partial regions 704a and 704b are also rectangular. Furthermore, the projection exposure apparatus is developed such that the angles α and β have substantially no profile. This can be achieved by using a projection optical unit whose entrance pupil is at a large distance from the object plane; this is referred to as a projection optical unit that is telecentric on the object side. Such a distance can be for example greater than 3 m, in particular greater than 50 m, in particular greater than 1000 m. In the present case, the distance is 5 m. A detailed illustration concerning a projection optical unit having an entrance pupil which is at a distance of 1000 m from the object plane may be found in the description concerning FIG. 8.

FIG. 7b illustrates the profile of the angles α and β for such a system. The angle β is essentially 6° in a constant fashion over the field, whereas the angle α is almost 0°. Since the variation of the angles over the field is only very small, the difference in the centroid direction vectors of the radiation at a point in the overlap region 741 between the first and second operating states is only minimal, such that only minimal variations of projection and shadow effects occur. Therefore, no difficulties occur in the juxtaposition of object fields since the centroid direction of the radiation in the overlap region in the first operating state does not differ significantly from the centroid direction of the radiation in the overlap region in the second operating state.

Here, too, the value of the scalar triple product at the location 743 can be calculated by way of example. This point has the x coordinate $x_p = 50$ mm and the y coordinate $y_p = 0$ and lies thus in the overlap region. The left-hand partial region 704a is illuminated in the first operating state. The entrance pupil lies at $x_{EP} = 0$, $y_{EP} = -525.52$ mm, $z_{EP} = 5000$ mm. The distance $y_p$ was chosen in the design of the projection optical unit such that the average angle of incidence at the object field is 6°.

In order that the centroid direction of the radiation runs in the direction of the entrance pupil after reflection, the following holds true for the first centroid direction vector $\vec{s}_1$:

$$\vec{s}_1 = \frac{1}{\sqrt{(x_{EP}-x_P)^2 + (y_{EP}-y_P)^2 + (z_{EP}-z_P)^2}} \begin{pmatrix} x_{EP} - x_P \\ y_{EP} - y_P \\ -(z_{EP} - z_P) \end{pmatrix}$$

$$\approx \begin{pmatrix} -0.0099 \\ -0.1045 \\ -0.9944 \end{pmatrix}$$

The right-hand partial region 704b is illuminated in the second operating state. In this case, the entrance pupil lies at $x_{EP} = 90$, $y_{EP} = 525.52$ mm, $z_{EP} = 5000$ mm. This position results from the fact that the object field 803 was offset by 90 mm in the x direction relative to the object plane. The centroid direction vector $\vec{s}_2$, thus has the value $$\vec{s}_2 = \frac{1}{\sqrt{(x_{EP}-x_P)^2 + (y_{EP}-y_P)^2 + (z_{EP}-z_P)^2}} \begin{pmatrix} x_{EP} - x_P \\ y_{EP} - y_P \\ -(z_{EP} - z_P) \end{pmatrix}$$

$$\approx \begin{pmatrix} 0.0080 \\ -0.1045 \\ 0.9944 \end{pmatrix}$$

The normalized vector that is perpendicular to the mask has the following notation in this system of coordinates:

$$\vec{n} = \begin{pmatrix} 0 \\ 0 \\ 1 \end{pmatrix},$$

with the result that the scalar triple product has the value S:

$$S = \vec{n} \cdot (\vec{s}_1 \times \vec{s}_2) \approx 0.00187$$

Figure 8:
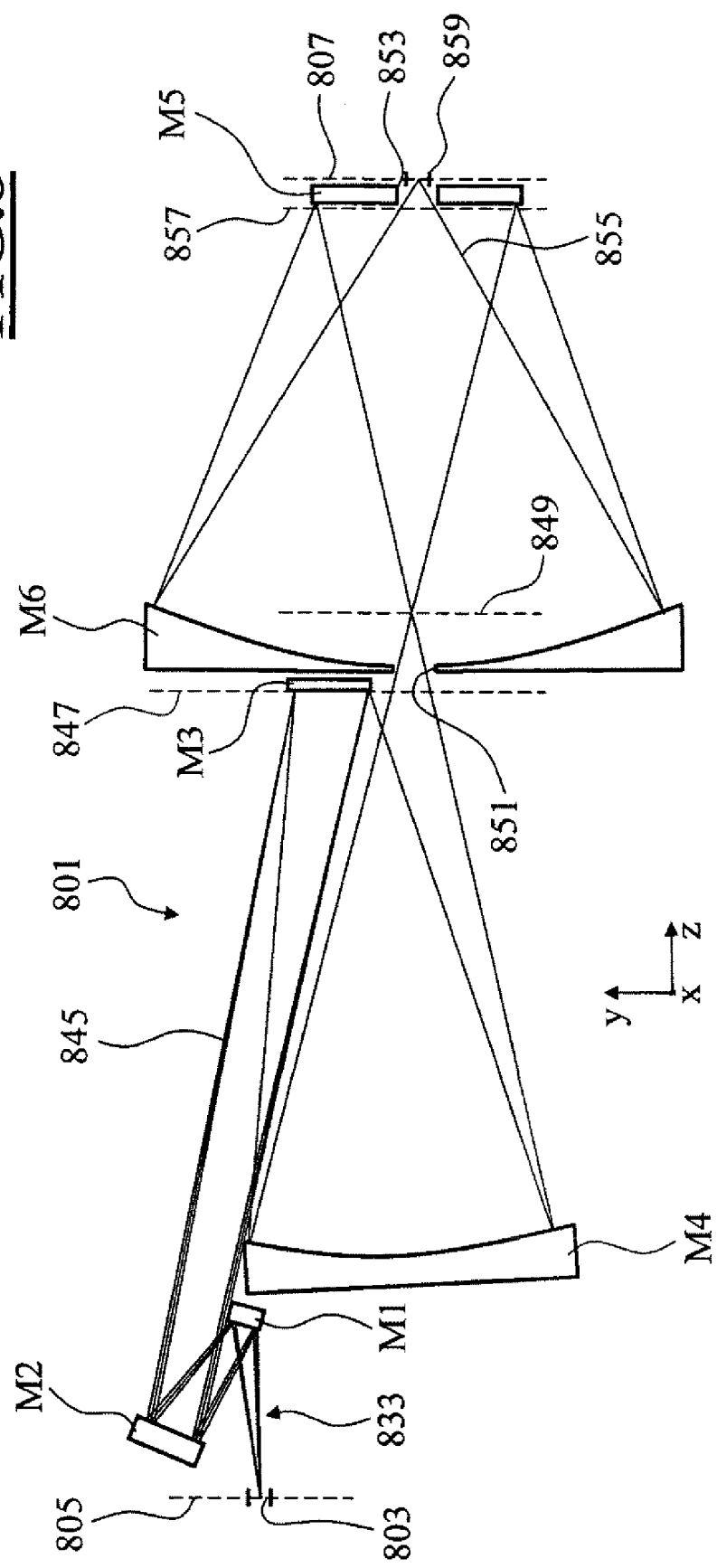
FIG. 8 projection optical unit that is telecentric from the object side.

FIG. 8 shows the optical design of one possible projection optical unit 1. The illustration shows the beam path in each case of two individual beams 845 proceeding from five object field points that lie one above another in FIG. 8 and are spaced apart from one another in the y direction, wherein the two individual beams 45 associated with one of the five object field points are assigned in each case to two different illumination directions for the five object field points. These two illumination directions are represented by the upper coma beam and the lower coma beam of each of the five object field points.

Proceeding from the object plane 805, the individual beams 845 are firstly reflected by a first mirror M1 and subsequently by further mirrors, which are designated as mirrors M2, M3, M4, M5 and M6 hereinafter in the order of the beam path. The projection optical unit 801 according to FIG. 8 therefore has six reflective mirrors. These mirrors bear a coating that is highly reflective to the wavelength of the radiation 833 if this is desired on account of the wavelength, for example in the EUV. Radiations having wavelengths that differ greatly from one another can also be guided in the projection optical unit 801 since these optical units have substantially achromatic properties. It is therefore possible for example to guide an alignment laser or to operate an autofocusing system in these optical units, wherein at the same time a wavelength that differs greatly from the operating wavelength thereof is employed for the illumination light. Thus, an alignment laser can operate at 632.8 nm, at 248 nm or at 193 nm, while radiation in the range of between 5 and 15 nm is employed at the same time.

The mirror M3 has a convex basic shape, that is to say can be described by a convex best-matched surface. In the description hereinafter, mirrors of this type are referred to in simplified fashion as convex, and mirrors that can be described by a concavely best-matched surface are referred to in simplified fashion as concave. The convex mirror M3 provides for a good Petzval correction in the projection optical unit 801.

An entrance pupil plane of the projection optical unit 801 according to FIG. 8 lies 1000 m in front of the object plane 805 in the beam path of the of the radiation 833. The projection optical unit 801 according to FIG. 8 has a structural length, that is to say a distance between the object plane 805 and the image plane 807, of 2000 mm.

Those individual beams 845 which proceed from spaced-apart object field points and are assigned to the same illumination direction thus run between the object field 803 and the first mirror M1 in virtually parallel fashion into the projection optical unit 801. The principal rays of the individual beams 845 thus form an angle of virtually 0° with respect to one another in the beam path of the radiation 833 between the object plane 805 and the mirror M1.

The individual beams 845 associated with a specific illumination direction of the five object field points are combined in a pupil plane 847 of the projection optical unit 801, adjacent to which the mirror M3 is arranged. The mirror M3 is therefore also referred to as pupil mirror. An aperture diaphragm for delimiting the illumination light beam bundle can be arranged in the pupil plane 847. The aperture diaphragm can be provided by a mechanical and interchangeable diaphragm or else in the form of a corresponding coating directly on the mirror M3.

The mirrors M1 to M4 image the object plane 805 into an intermediate image plane 849. The intermediate-image-side numerical aperture of the projection optical unit 801 is approximately 0.2. The mirrors M1 to M4 form a first partial imaging optical unit of the projection optical unit 801 with a demagnifying imaging scale of approximately 3.2×. The downstream mirrors M5 and M6 form a further partial imaging optical unit of the projection optical unit 801 with a demagnifying imaging scale of approximately 2.5×. In the beam path of the radiation 833 between the mirrors M4 and M5 upstream of the intermediate image plane 849 and adjacent thereto, a through opening 851 is formed in the mirror M6, through which opening the illumination or imaging radiation 833 passes upon reflection from the fourth mirror M4 to the fifth mirror M5. The fifth mirror M5 in turn has a central through opening 853, through which the radiation bundle 855 passes between the sixth mirror M6 and the image plane 807.

The fifth mirror M5, which together with the sixth mirror M6 images the illumination or imaging radiation 833 from the intermediate image plane 849 into the image plane 807, is arranged in proximity to a further pupil plane 857 of the projection optical unit 801, which further pupil plane is conjugate with respect to the first pupil plane 847. The further pupil plane 857 in the beam path of the imaging light lies spatially adjacent to the fifth mirror M5 and in the beam path between the fifth mirror M5 and the sixth mirror M6, such that a physically accessible diaphragm plane exists at the location of the further pupil plane 857. In the diaphragm plane, an aperture diaphragm can alternatively or additionally likewise be arranged, as described above in connection with the aperture diaphragm in the region of the pupil plane 847.

The projection optical unit 801 has an obscuration diaphragm arranged in centered fashion in one of the pupil planes 847, 857. The partial beams of the projection beam path which are assigned to the central through openings 851, 853 in the mirrors M6, M5 are thereby obscurated. Therefore, the design of the projection optical unit 801 is also referred to as a design with central pupil obscuration.

A distinguished individual beam 845 that links a central object field point to a centrally illuminated point in the entrance pupil of the projection optical unit 801 is also referred to as the principal ray of a central field point. The principal ray of the central field point, starting from the reflection at the sixth mirror M6, forms approximately a right angle with the image plane 807, that is to say runs approximately parallel to the z axis of the projection optical unit 801. The angle is greater than 85°.

The image field 859 is rectangular. The image field 859 has an extent of 13 mm parallel to the x direction. The image field 859 has an extent of 1 mm parallel to the y direction. Projection optical units such as are known from the prior art usually have image fields having an extent parallel to the x direction which is 26 mm or more. The typical applications of microlithography projection exposure apparatuses are therefore adapted to such an extent. The microlithography projection exposure apparatus according to the disclosure also makes it possible to use projection optical units having a smaller extent parallel to the x direction for the same typical applications. The image field 859 lies centrally behind the fifth mirror M5. The radius R of the through opening 853 has to satisfy the following relation for vignetting-free imaging:

$$R \geq \frac{1}{2} \cdot D + d_w \cdot NA.$$

In this case, D is the diagonal of the image field 859. $d_w$ is the free working distance of the mirror M5 from the image plane. The free working distance is defined as the distance between the image plane 807 and the section closest thereto of a utilized reflection surface of the closest mirror of the projection optical unit 801, that is to say of the mirror M5 in the embodiment according to FIG. 8. NA is the image-side numerical aperture.

All six mirrors M1 to M6 of the projection optical unit 801 are embodied as freeform surfaces which cannot be described by a rotationally symmetrical function. Other embodiments of the projection optical unit 801 are also possible in which at least one of the mirrors M1 to M6 has a freeform reflection surface of this type.

A freeform surface of this type can be produced from a rotationally symmetrical reference surface. Freeform surfaces of this type for reflection surfaces of the mirrors of projection optical units of projection exposure apparatuses for microlithography are known from US 2007-0058269 A1.

The freeform surface can be described mathematically by the following equation:

$$Z = \frac{cr^2}{1 + \sqrt{1-(1+k)c^2r^2}} + \sum_{j=2}^{66} C_j X^m Y^n$$

where the following holds true:

$$j = \frac{(m+n)^2 + m + 3n}{2} + 1$$

Z is the sagitta of the freeform surface at the point x, y ($x^2+y^2=r$).

c is a constant corresponding to the vertex curvature of a corresponding asphere. k corresponds to a conical constant of a corresponding asphere. $C_j$ are the coefficients of the monomials $X^m Y^n$. The values of c, k and $C_j$ are typically determined on the basis of the desired optical properties of the mirror within the projection optical unit 801. The order of the monomial, m+n, can be varied as desired. A higher-order monomial can lead to a design of the projection optical unit with better image aberration correction, but is more complex to calculate. m+n can assume values of between 3 and more than 20.

Freeform surfaces can also be described mathematically by Zernike polynomials which are explained for example in the manual of the optical design program CODE V®. Alternatively, freeform surfaces can be described with the aid of two-dimensional spline surfaces. Examples thereof are Bezier curves or non-uniform rational basis splines (NURBS). Two-dimensional spline surfaces can be described for example by a network of points in an xy plane and associated z values or by these points and gradients associated with them. Depending on the respective type of spline surface, the complete surface is obtained by interpolation between the network points using e.g. polynomials or functions which have specific properties with regard to their continuity and differentiability. Examples thereof are analytical functions.

The mirrors M1 to M6 bear multiple reflection layers in order to optimize their reflection for the impinging EUV illumination radiation 833. The reflection is all the better, the closer the impingement angle of the individual beams 845 on the mirror surface is to perpendicular incidence. The projection optical unit 801 has small reflection angles overall for all individual beams 845.

The optical design data of the reflection surfaces of the mirrors M1 to M6 of the projection optical unit 801 can be gathered from the tables below. The first of these tables specifies, with respect to the optical surfaces of the optical components and with respect to the aperture diaphragm, in each case the reciprocal of the vertex curvature (radius) and a distance value (thickness) corresponding to the z distance between adjacent elements in the beam path, proceeding from the object plane. The second table specifies the coefficients $C_j$ of the monomials $X^m Y^n$ in the freeform surface equation specified above for the mirrors M1 to M6. In this case, Nradius represents a normalization factor. After the second table, the magnitude in mm along which the respective mirror, proceeding from a mirror reference design, was decentered (Y-decenter) and rotated (X-rotation) is also specified. This corresponds to the parallel displacement and the tilting in the case of the freeform surface design method described above. In this case, displacement is effected in the y direction and tilting is effected about the x axis. In this case, the angle of rotation is specified in degrees.

| Surface | Radius | Distance value | Operating mode |
|---|---|---|---|
| Object plane | Infinity | 263.973 | |
| M 1 | 294.632 | −163.973 | REFL |
| M 2 | 677.341 | 1121.158 | REFL |
| M 3 | 318.925 | −848.002 | REFL |
| M 4 | 396.851 | 1586.844 | REFL |
| M 5 | 1610.696 | −697.387 | REFL |
| M 6 | 951.407 | 737.387 | REFL |
| Image plane | Infinity | 0.000 | |

| Coefficient | M1 | M2 | M3 | M4 | M5 | M6 |
|---|---|---|---|---|---|---|
| K | −1.107380E+00 | −6.922178E−01 | 4.604190E−01 | −9.070490E−01 | 1.921763E+01 | 3.351539E−01 |
| Y | 0.000000E+00 | 0.000000E+00 | 0.000000E+00 | 0.000000E+00 | 0.000000E+00 | 0.000000E+00 |
| X2 | −1.128522E−03 | −1.453589E−04 | −6.996584E−04 | −7.777355E−04 | −1.436342E−04 | 3.354789E−05 |
| Y2 | −1.159973E−03 | −1.432548E−04 | −6.658993E−04 | −7.779247E−04 | −1.460604E−04 | 3.345270E−05 |
| X2Y | −8.685192E−08 | 9.438147E−09 | 2.709788E−07 | 4.768829E−10 | 1.219803E−09 | 7.494169E−10 |
| Y3 | −5.480818E−08 | 1.821581E−08 | 3.081899E−07 | 4.735357E−10 | 2.179734E−09 | 7.185939E−10 |
| X4 | 0.000000E+00 | 0.000000E+00 | −3.510369E−09 | −6.986158E−11 | 4.809903E−10 | 9.888892E−13 |
| X2Y2 | 0.000000E+00 | 0.000000E+00 | −7.066022E−09 | −1.393082E−10 | 9.641836E−10 | 1.778472E−12 |
| Y4 | 0.000000E+00 | 0.000000E+00 | −3.551286E−09 | −6.941280E−11 | 4.830886E−10 | 7.836027E−13 |
| Nradius | 1.000000E+00 | 1.000000E+00 | 1.000000E+00 | 1.000000E+00 | 1.000000E+00 | 1.000000E+00 |

| Coefficient | M1 | M2 | M3 | M4 | M5 | M6 | Image plane |
|---|---|---|---|---|---|---|---|
| Y-decenter | 131.752 | 232.510 | 15.389 | −92.550 | −104.036 | −104.318 | 0.000 |
| X-rotation | −12.787 | −21.267 | −1.854 | 3.418 | −0.205 | 0.032 | 0.000 |

An object image offset, that is to say a distance between a projection of the midpoint of the object field 803 onto the image plane 807 and the midpoint of the image field 859, is 208 mm in the case of the projection optical unit 3.

What is claimed is:

1. An exposure apparatus having first and second operating states, the exposure apparatus comprising:
   a reflective mask in an object plane of the exposure apparatus,
   wherein during use of the exposure apparatus:
      when the exposure apparatus is in the first operating state, a first partial region of the reflective mask is illuminated by a first radiation, the first radiation having a first centroid direction having a first centroid direction vector at each point of the first partial region of the reflective mask;
      when the exposure apparatus is in the second operating state, a second partial region of the reflective mask is illuminated by a second radiation, the second radiation having a second centroid direction having a second centroid direction vector at each point of the second partial region of the reflective mask;
the first and the second partial regions have a common overlap region;
at each point of a portion of the common overlap region, a scalar triple product of a normalized first centroid direction vector, a normalized second centroid direction vector and a normalized vector that is perpendicular to the reflective mask is less than 0.05; and
the exposure apparatus is a microlithography projection exposure apparatus.

2. The exposure apparatus of claim 1, wherein, at each point of the portion of the common overlap region, the scalar triple product of the normalized first centroid direction vector, the normalized second centroid direction vector and the normalized vector that is perpendicular to the reflective mask is less than 0.03.

3. The exposure apparatus of claim 1, wherein, at each point of the portion of the common overlap region, the scalar triple product of the normalized first centroid direction vector, the normalized second centroid direction vector and the normalized vector that is perpendicular to the reflective mask is less than 0.01.

4. The exposure apparatus of claim 1, wherein, at each point of the portion of the common overlap region, an angle between the first centroid direction and the normalized vector that is perpendicular to the mask is 3° or larger.

5. The exposure apparatus of claim 1, wherein the common overlap region is smaller than the first partial region, and the common overlap region is smaller than the second partial region.

6. The exposure apparatus of claim 1, wherein an orientation of the reflective mask in the first operating state differs from an orientation of the mask in the second operating state by a rotation through 180° about an axis perpendicular to the object plane of the exposure apparatus.

7. The exposure apparatus of claim 1, further comprising a projection optical unit configured to image the object field of the exposure apparatus onto an image field, wherein the image field has a maximum extent of 13 mm.

8. The exposure apparatus of claim 1, wherein the exposure apparatus is configured to operate with radiation having a wavelength of between 5 nm and 15 nm.

9. A method of producing microelectronic components using the microlithography projection exposure apparatus of claim 1, the method comprising:
in a first exposure, exposing the first partial region of the reflective mask with the first radiation; and
in a second exposure, exposing the second partial region of the reflective structure-bearing mask with the second radiation,
wherein:
the reflective mask is a reflective structure-bearing mask;
the first exposure images the first partial region of the reflective structure-bearing mask onto a substrate in an image plane; and
the second exposure images the second partial region of the reflective structure-bearing mask onto the substrate in the image plane.

10. The method of claim 9, wherein, at each point of the common overlap region, the scalar triple product of the normalized first centroid direction vector, the normalized second centroid direction vector and the normalized vector that is perpendicular to the mask is less than 0.03.

11. The method of claim 9, wherein, at each point of the common overlap region, the scalar triple product of the normalized first centroid direction vector, the normalized second centroid direction vector and the normalized vector that is perpendicular to the mask is less than 0.01.

12. The method of claim 9, wherein, at each point of the portion of the common overlap region, an angle between the first centroid direction and the normalized vector that is perpendicular to the mask at each point is 3° or larger.

13. The method of claim 12, wherein the first and second scanning directions are parallel or antiparallel.

14. The method of claim 9, wherein the radiation has a wavelength of between 5 nm and 15 nm.

15. The method of claim 9, wherein the first and second exposures are performed using a scanning process in which the reflective mask is moved through an illumination field along a first scanning direction during the first exposure, and the reflective mask is moved through the illumination field along a second scanning direction during the second exposure.

16. The method of claim 9, wherein a maximum angle between two arbitrary first centroid direction vectors is less than 1°.

17. The method of claim 9, wherein a maximum angle between two arbitrary second centroid directions is less than 1°.

18. The method of claim 9, wherein, at each point of the common overlap region, an angle between the first and second centroid directions vector is less than 1°.

19. The method of claim 9, wherein, at each point of the common overlap region, an angle between a plane formed by the first and second centroid direction vectors and the normalized vector that is perpendicular to the mask is less than 1°.

20. The method of claim 9, further comprising, between the first and the second exposures, rotating the structure-bearing reflective mask through 180°.

21. The apparatus of claim 1, further comprising an actuating device configured to i) rotate the reflective mask about an axis perpendicular to the object plane, or ii) rotate an illumination optical unit and a projection optical unit of the exposure apparatus about the axis perpendicular to the object plane.

22. The apparatus of claim 1, further comprising a projection optical unit that is telecentric on an object side.

23. An exposure apparatus having first and second operating states, the exposure apparatus comprising:
a reflective mask in an object plane of the exposure apparatus,
wherein:
an orientation of the reflective mask in the first operating state differs from the orientation of the mask in the second operating state by a rotation of each point on the entire reflective mask through 180° about an axis perpendicular to the object plane of the exposure apparatus, the axis being perpendicular to a reflective surface of the reflective mask; and
the exposure apparatus is a microlithography projection exposure apparatus.

24. The exposure apparatus of claim 23, further comprising a projection optical unit configured to image the object field of the exposure apparatus onto an image field, wherein the image field has a maximum extent of 13 mm.

25. The exposure apparatus of claim 23, wherein the exposure apparatus is configured to operate with radiation having a wavelength of between 5 nm and 15 nm.

* * * * *

UNITED STATES PATENT AND TRADEMARK OFFICE
CERTIFICATE OF CORRECTION

| | | |
|---|---|---|
| PATENT NO. | : 9,529,276 B2 | |
| APPLICATION NO. | : 13/040956 | |
| DATED | : December 27, 2016 | |
| INVENTOR(S) | : Hans-Juergen Mann et al. | |

It is certified that error appears in the above-identified patent and that said Letters Patent is hereby corrected as shown below:

In the Specification

Column 13, Line 9, before "radiation", delete "of the".

Signed and Sealed this
Twenty-third Day of May, 2017

Michelle K. Lee
*Director of the United States Patent and Trademark Office*